United States Patent [19]
Ogino

[11] Patent Number: 6,166,944
[45] Date of Patent: Dec. 26, 2000

[54] DATA STORING APPARATUS INCLUDING INTEGRATED MAGNETIC MEMORY CELLS AND SEMICONDUCTOR DEVICES

[75] Inventor: Hiroyuki Ogino, Kyoto, Japan

[73] Assignee: Kyoto University, Japan

[21] Appl. No.: 09/292,986

[22] Filed: Apr. 16, 1999

[30] Foreign Application Priority Data

Apr. 20, 1998 [JP] Japan .................................. 10-109291

[51] Int. Cl.⁷ .................................................. G11C 17/02
[52] U.S. Cl. ................................ 365/97; 365/33; 365/50; 365/66; 365/55
[58] Field of Search ................................ 365/33, 97, 50, 365/66, 55

[56] References Cited

U.S. PATENT DOCUMENTS

| 5,329,486 | 7/1994 | Lage | 365/145 |
| 5,798,963 | 8/1998 | Iga | 365/97 |

FOREIGN PATENT DOCUMENTS

| 54-18131 | 2/1979 | Japan . |
| 61-050277 | 3/1986 | Japan . |

OTHER PUBLICATIONS

Appendix II, Japanese Utility Model Application Opened No. 18131/79, opened Feb. 6, 1979, Application Serial No. 84072/78, filed Mar. 22, 1973, "Memory Device".

Appendix III, Partial English Translation of the Article, "Digital Memory", p. 225, last line—p. 226, line 5; p. 227, lines 3–4.

"Digital Memory", pp. 221–227, Sanpo Shuppan Co., Ltd., published May 25, 1972.

*Primary Examiner*—Richard Elms
*Assistant Examiner*—VanThu Nguyen
*Attorney, Agent, or Firm*—Burns, Doane, Swecker & Mathis, L.L.P.

[57] ABSTRACT

A data storing apparatus in which a magnetic storing means includes magnetic memory cells for memorizing data of a first value or a second value. Input data is written to the memory cells separately or simultaneously by electromagnetic induction. One or more magnetic memory cells are selected, with respect to which the data is to be read or written. Each magnetic memory cell has a ferromagnetic body holding the data of the first value or the second value in accordance with direction of magnetization or magnetizing force thereof. The current control means performs the reading or writing of the data with respect to the selected magnetic cells. The current control means comprises semiconductor devices and controls current therethrough in both directions.

19 Claims, 14 Drawing Sheets

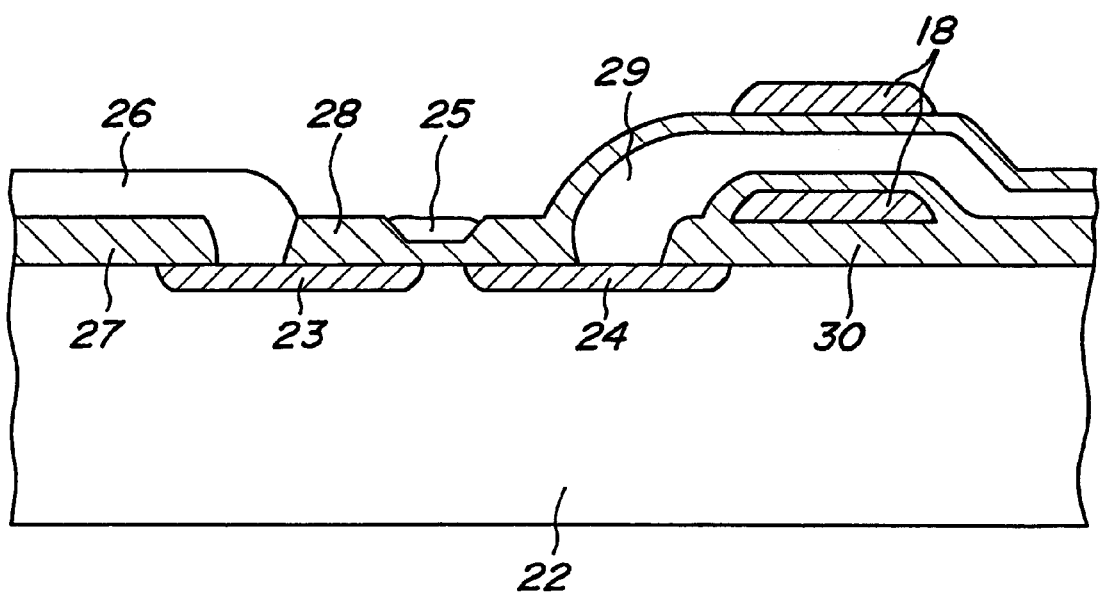
FIG_3

FIG_9A
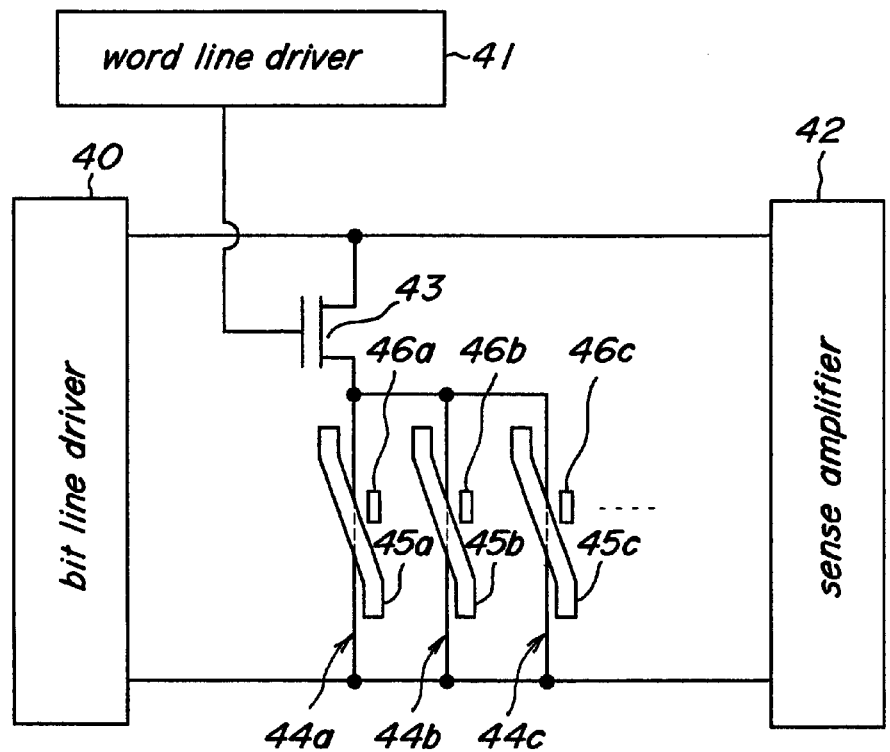
FIG_9B
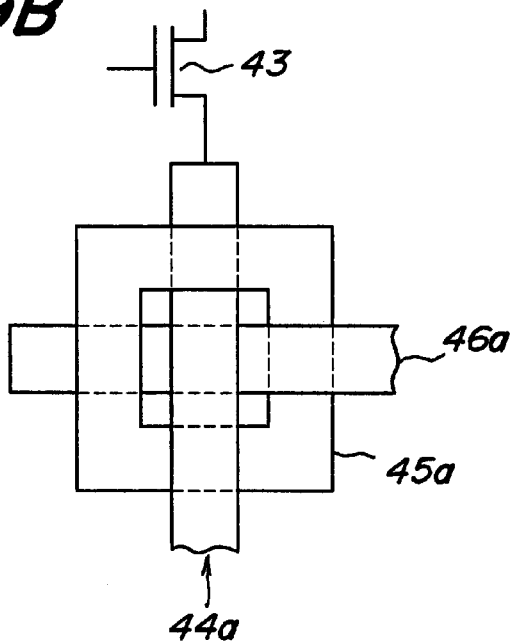

FIG_10
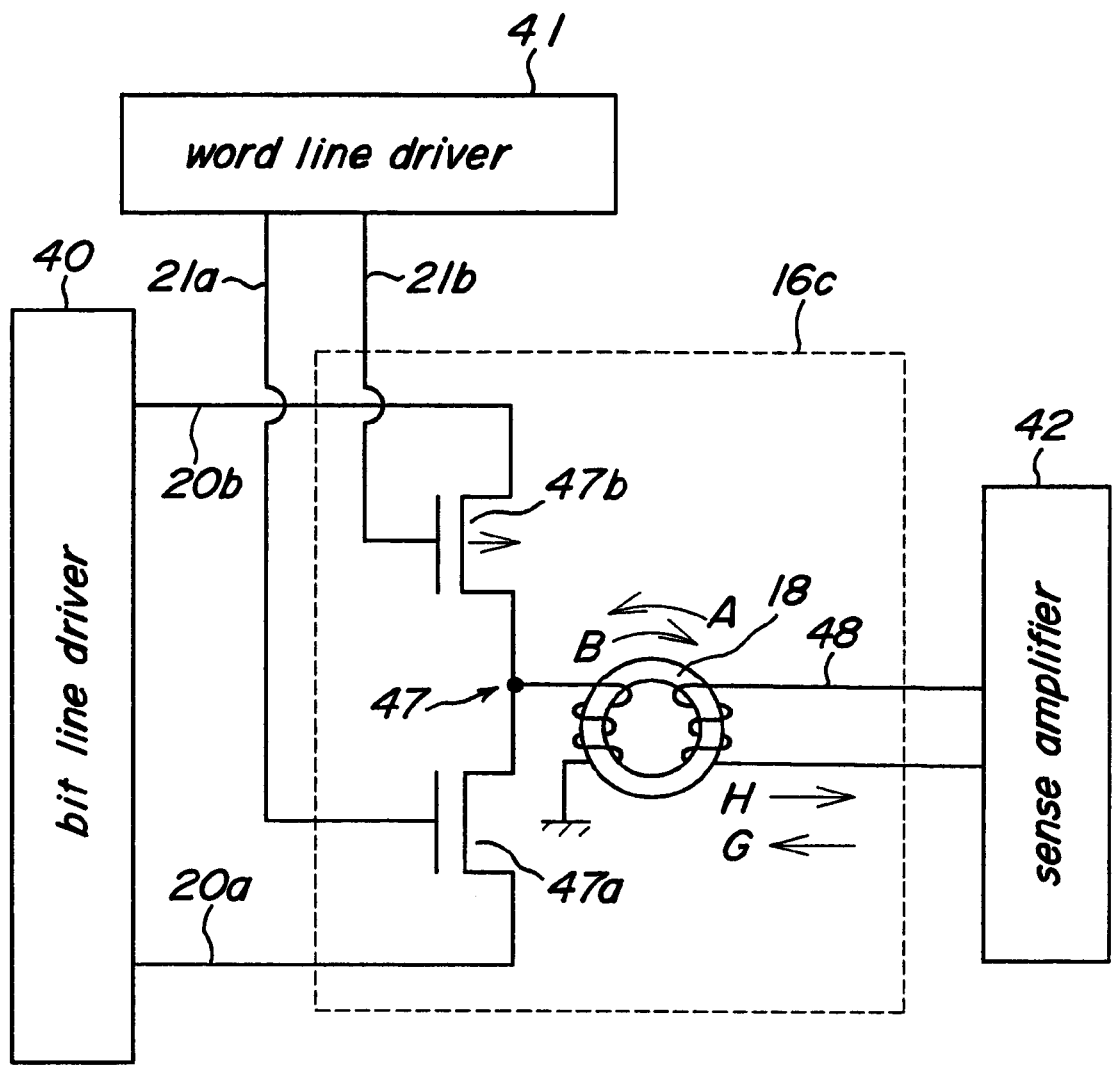

FIG._14
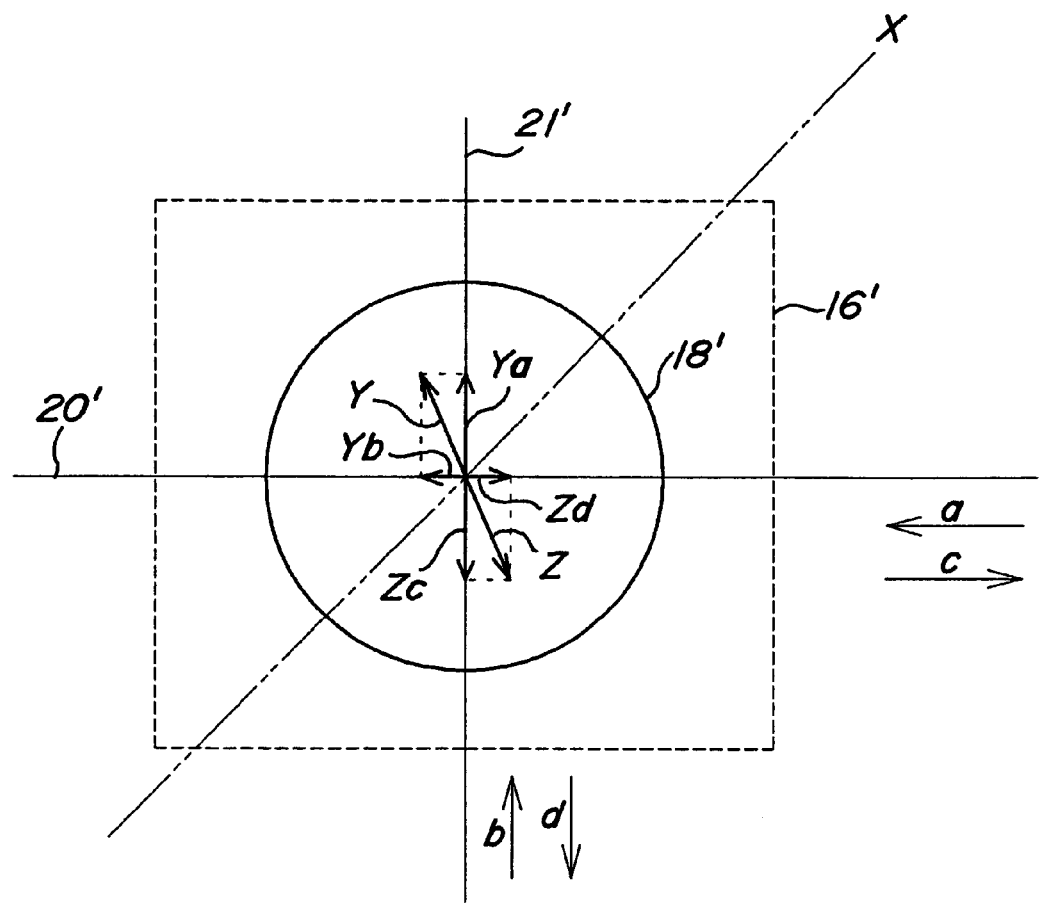
FIG._15
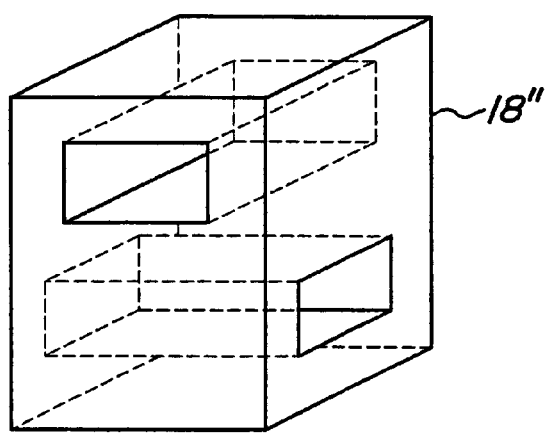

DATA STORING APPARATUS INCLUDING INTEGRATED MAGNETIC MEMORY CELLS AND SEMICONDUCTOR DEVICES

BACKGROUND OF THE INVENTION

1. Field of the Invention

The present invention relates to a data storing apparatus including magnetic memory cells and semiconductor devices, which can be used as a main memory, by utilizing a hysteresis property of a ferromagnetic body, and reading and writing data in accordance with electromagnetic induction, with an element such as a transistor for controlling current therethrough in both directions.

2. Description of the Related Art

A main memory for computers is conventionally comprised of:

(1) SRAM (Static Random Access Memory),
(2) DRAM (Dynamic Random Access Memory),
(3) EEPROM (Electrically Erasable Programmable Read Only Memory),
(4) flush memory,
(5) ferroelectric memory, or
(6) core memory.

The SRAM is a semiconductor memory which utilizes an on/off action of a flip-flop circuit. Generally, by using a bistable condition of a pair of transistors when memorizing, it is possible to perform a non-destructive readout. Thus, the SRAM is capable of storing data rapidly and statically. However, as current always flows through the SRAM, and it is necessary to have a large number of elements in the SRAM, it is disadvantageous to consume a large amount of electric power and occupy a large area of the memory. Moreover, as the SRAM has a volatile property, it is disadvantageous to erase data in the memory when a power supply thereof is turn-off.

The DRAM is a semiconductor memory which utilizes a charge of one or more capacitors. It can generally be composed of a small number of MOS transistors which are main components. Further, the entire area of the memory can be made small by using one or more capacitors which have a three dimensional form as one or more memory elements. In the DRAM, as the discharges stored as the information have been lost as time goes, it is necessary to refresh the DRAM at a constant interval to maintaining data in the DRAM. Further, as the destructive readout is carried out in the DRAM, a data rewriting is needed after the memory is read. Moreover, as the DRAM also have the volatile property, it is disadvantageous to erase the memory when the power supply is turned-off.

The EEPROM and the flush memory are semiconductor memories which are reloadable read only memories. They are classified as non-volatile memories which do not erase data even if a power supply thereof is turned-off. In case where the EEPROM or the flush memory is used, the difference between the reading time thereof and the writing time thereof is large, so that the reading time is asymmetrical to the writing time. Also, it is unfavorable to have less number of writable times than the SRAM and the DRAM.

The ferroelectric memory is a memory which has been developed recently, and it can be constructed as a high-speed and non-volatile memory or a memory which is able to be used in non-destructive readout mode. In term of the ferroelectric memory, the selection of material which is composed of the thin film of the ferroelectric body and the technique of the formation thereof are not fully established, and the property of matter about the thin film which guarantees the reliability thereof is not obvious. Also, it is disadvantageous to have less number of writable times than the SRAM and the DRAM. Therefore, it cannot be used instead of the SRAM or the DRAM as the main memory in these days.

The core memory is a typical memory which utilizes magnetization of the core. The use of such a memory has been quite popular in the past. It also has a non-volatile property. In case of the core memory, it can carry out the non-destructive readout in rapid and non-volatile manner. However, it does not suit the mass production because the assembling thereof needs the manual working, so that the manufacture thereof get hard as the mass storing is desired, and it have not used rapidly as the semiconductor memories such as the SRAM, the DRAM, or the like have been developed. An operating system at the present time when the core memory has been quite popular, does not fully put to practice use the core memory having the non-volatile property.

On the other hand, a memory element having one or more magneto-resistance elements has been recently proposed. Such a memory utilizes a magneto-resistance effect or giant magneto-resistance effect, and develops from a technique in a magnetic head of a hard disc. In the memory element having one or more magneto-resistance elements which utilizes the magneto-resistance effect or giant magneto-resistance effect, the magneto-resistance element is in way of development and the magneto-resistance element is mainly utilized in a magnetic head of a hard disc, so that the research and development of the magnetic head are mainly carried out and it has not put into practice as the main memory for computers yet.

It is highly desirable that a memory can be operated at high-speed, has a large capacity and non-volatile property. However, none of the above-mentioned conventional memory devices satisfies the above mentioned conditions at the same time.

DISCLOSURE OF THE INVENTION

It is an object of the present invention to provide a data storing apparatus including magnetic memory cells and semiconductor devices without the above-mentioned disadvantages of the prior art.

It is another object of the present invention to provide a data storing apparatus including magnetic memory cells and semiconductor devices which has high-speed, mass-storing and non-volatile properties.

It is still another object of the present invention to provide a data storing apparatus including magnetic memory cells and semiconductor devices which is able to perform the non-destructive readout resulted from the non-volatile property.

It is yet another object of the present invention to provide a data storing apparatus including magnetic memory cells and semiconductor devices which has an asymmetric property in which data can be read more rapidly.

According to the present invention, there is provided a data storing apparatus including integrated magnetic memory cells and semiconductor devices, comprising: magnetic storing means having the magnetic memory cells, each of which memorizes data of a first value or a second value; data input means in which the data is input to the apparatus; data writing means for writing the data which is input from the data input means at the memory cells separately or simultaneously in accordance with electromagnetic induction; selection means for selecting one or more magnetic memory cells from which the data is to be read, and to which the data is to be written; and data output means for outputting the data which is read from the data reading means from the apparatus; each of the magnetic memory cells having a ferromagnetic body holding the data of the first value or the second value according to direction of magnetization or magnetizing force thereof; current means for performing the reading of the data from the selected magnetic cell or cells and the writing of the data into the selected magnetic cell or cells, the current control means comprising semiconductor devices and controlling current therethrough in both directions.

In the above-mentioned apparatus according to the present invention, as shown in FIG. 1, when the data of the first value or the second value is input to the data input means 1, the selection means 2 selects at least one magnetic memory cell 4 in the magnetic memory means 3 to which the data is to be written. Then, the data writing menu 5 writes the data into the selected magnetic memory cell or cells 4 separately or simultaneously in accordance with electromagnetic induction. Each memory cell 4 stores the data of the first value or the second value according to direction of magnetization or magnetizing force in the corresponding ferromagnetic body 6. In reading and writing data, current control means 7 corresponding to each the magnetic memory cell 4 is used, for example.

When the magnetic memory cells 4 to be read by the selection means 2 are selected, the data reading means 8 reads the data from the selected magnetic memory cell or cells 4 separately or simultaneously in accordance with electromagnetic induction. The data read by the data reading means 8 is output from the apparatus through the data output means 9. The current control means 7 is used when reading the data.

With such a construction, as the apparatus according to the present invention has the non-volatile property, the non-volatile readout can be achieved. Because of the asymmetric property in which data can be read more rapidly, it is possible to shorten the delay time between a cache memory and the main memory. If the apparatus has a large amount of storage, it can be used in place of the magnetic disc, through, without occurrence of a large delay time between the main memory and a secondary storage. Therefore, the memory in a system can perform a fast storage action. Further, if it is formed on an integrated circuit, such magnetic memory cells can be formed to have a desired two or three-dimensional form, so that the memory can have a large amount of storage. Moreover, by storing the data of the first value or the second value according to direction of magnetization or magnetizing force, the memory thereof is not erased even if the voltage supply is turned-off, so that the memory can have the non-volatile property. The apparatus according to the invention does not suffer from the above-mentioned disadvantages of the prior art.

Preferably, the first value corresponds to a first residual magnetism with a magnetic field in the ferromagnetic body being zero, the second value corresponds to a second residual magnetism with a magnetic field in the ferromagnetic body being zero; magnetizing force of the first residual magnetism is substantially same as that of the second residual magnetism; and the sign of the first residual magnetism is opposite to that of the second residual magnetism.

In this case, the first value corresponds to a first residual magnetism with a magnetic field in the ferromagnetic body 6 being zero, the second value corresponds to a second residual magnetism with a magnetic field in the ferromagnetic body 6 being zero. In other words, direction of magnetization is changed by the movement of the magnetic domain wall. In this case, the sign of the first residual magnetism is opposite to that of the second residual magnetism.

By determining the first value or the second value using 1-bit in accordance with the first residual magnetism or the second residual magnetism in such a way, high-speed, mass-storing and non-volatile functions can be achieved without above-mentioned disadvantages of the prior art.

More preferably, each of the magnetic memory cells has the current control means.

In one embodiment of the apparatus the current control means comprises a MOS transistor. In this embodiment, the MOS transistor is used as the current control means, so that high-speed, mass-storing and non-volatile functions can be realized without the above-mentioned disadvantages of the prior art.

In another embodiment of the apparatus, the current control means comprises a CMOS. By using the CMOS as the current control means, high-speed, mass-storing and non-volatile functions can be achieved without the above-mentioned disadvantages of the prior art.

In another embodiment of the apparatus, the current control mean comprises a first conductive type of a transistor and a second conductive type of a transistor. As the first conductive type of the transistor and the second conductive type of the transistor are utilized in such a way, high-speed, mass-storing and non-volatile functions are possible without the above-mentioned drawbacks of the prior art.

More preferably, the magnetic memory cells have a matrix form. In this case, the memory capacity of the apparatus becomes larger.

In another embodiment of the apparatus, the current control means has first current control sections corresponding to respective raw of the magnetic memory cells, and second current control sections corresponding to respective array of the magnetic memory cells; each of the first and second current control sections comprises a MOS transistor. In this case, high-speed, mass-storing and non-volatile functions can be achieved without the above-mentioned drawbacks of the prior art. Further, as it is not required that each of the magnetic memory cells has respective transistor, the number of transistors can be decreased.

In one embodiment of the apparatus, the readout mode by said data reading means is a destructive readout mode in which the data in the one or more magnetic memory cells are destructed once the data therein are read. By performing the destructive readout mode, the reading time by the data reading means becomes a symmetric to the writing time by the data writing means, so that the output from the data output means made stronger.

In another embodiment of the apparatus, the readout mode by the reading means is a non-destructive readout mode in which the data in the one or more magnetic memory cells are not destructed even if the data therein are read. By performing the non-destructive readout mode, the reading time by the data reading means becomes asymmetric to the writing time by the data writing means. As a result, the time required to read the data can make much smaller than that required to write the data.

Preferably the ferromagnetic body comprises a ferromagnetic thin film; the first value corresponds to a first easy axis of magnetization, and the second value corresponds to a second easy axis of magnetization which has direction opposite to that of the first easy axis of magnetization. By determining the first value or the second value using 1-bit in accordance with the first easy axis of magnetization or the second easy axis of magnetization, i.e. rotation of the easy axis of magnetization in such a way, high-speed, mass-storing and non-volatile functions can be achieved without the above-mentioned disadvantages of the prior art.

More preferably, each of the magnetic memory cells has the current control means.

In one embodiment of the apparatus, the current control means comprises a MOS transistor. In this embodiment, the MOS transistor is used as the current control means, so that high-speed, mass-storing and non-volatile functions can be realized without the above-mentioned disadvantages of the prior art.

In another embodiment of the apparatus, the current control means comprises a CMOS. By using the CMOS as the current control means, high-speed, mass-storing and non-volatile functions can be achieved without the above-mentioned disadvantages of the prior art.

In another embodiment of the apparatus, the current control means comprises a first conductive type of a transistor and a second conductive type of a transistor. As the first conductive type of the transistor and the second conductive type of the transistor are utilized in such a way, high-speed, mass-storing and non-volatile functions are possible without the above-mentioned drawbacks of the prior art.

More preferably, the magnetic memory cells have a matrix form. In this case, the memory capacity of the apparatus becomes larger.

In another embodiment of the apparatus, the current control means has first current control sections corresponding to respective raw of the magnetic memory cells, and second current control sections corresponding to respective array of the magnetic memory cells; each of the first and second current control sections comprises a MOS transistor. According to the embodiment, high-speed, mass-storing and non-volatile functions can be achieved without the above-mentioned drawbacks of the prior art. Further, as it is not required that each of the magnetic memory cells has respective transistor, the number of transistors can be decreased.

In one embodiment of the apparatus, the readout mode by the data reading means is a destructive readout mode in which the data in the one or more magnetic memory cells are destructed once the data therein are read. By performing the destructive readout mode, the reading time by the data reading means becomes symmetric to the writing time by the data writing means, so that the output from the data output means made stronger.

In another embodiment of the apparatus, the readout mode by the reading means is a non-destructive readout mode in which the data in the one or more magnetic memory cells are not destructed even if the data therein are read. By performing the non-destructed readout mode, the reading time by the data reading time becomes asymmetric to the writing means by the data writing means. As a result, the time required to read can make much smaller than that required to write.

BRIEF DESCRIPTION OF THE DRAWINGS

FIG. 3 is a sectional view of the magnetic memory cell shown in FIG. 2;

FIG. 9A is a schematic view showing the magnetic memory cell shown in FIG. 2, which magnetic memory has a multilayer;

FIG. 9B is a top view of a part of the magnetic memory cell shown in FIG. 9A;

FIG. 10 is a detail drawing of further magnetic memory shown in FIG. 2;

FIG. 14 is a drawing to explain the operation of the apparatus shown in FIG. 12;

FIG. 15 is a perspective view showing a biaxial element; and

DESCRIPTION OF THE PREFERRED EMBODIMENTS

Figure 1:
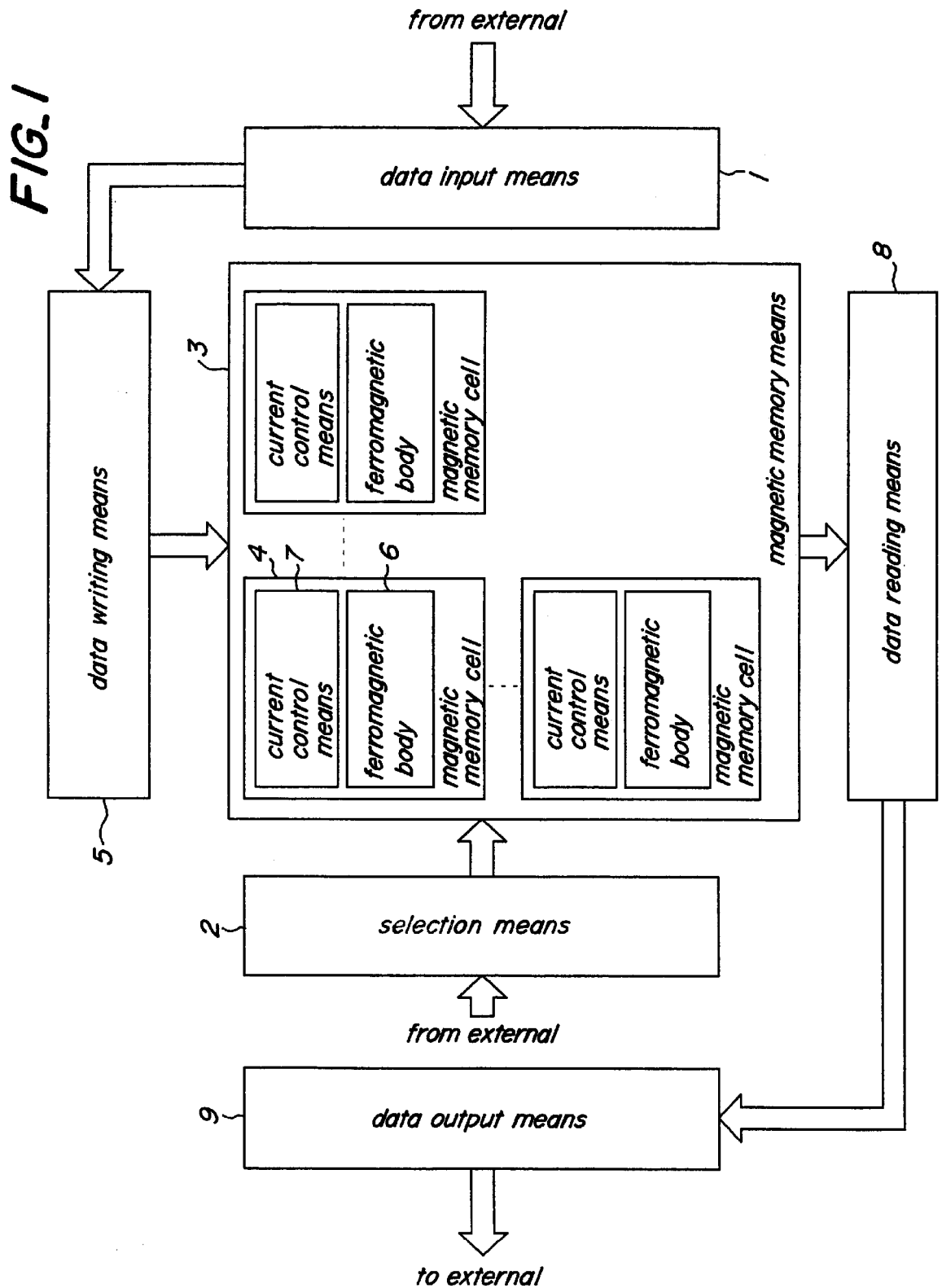
FIG. 1 is a schematic diagram showing the general arrangement of the apparatus according to the invention.

Embodiment of the apparatus including integrated magnetic memory cells and semiconductor devices will be explained below with reference to the accompanying drawings, wherein the same reference numerals denote the same or corresponding elements.

Figure 2:
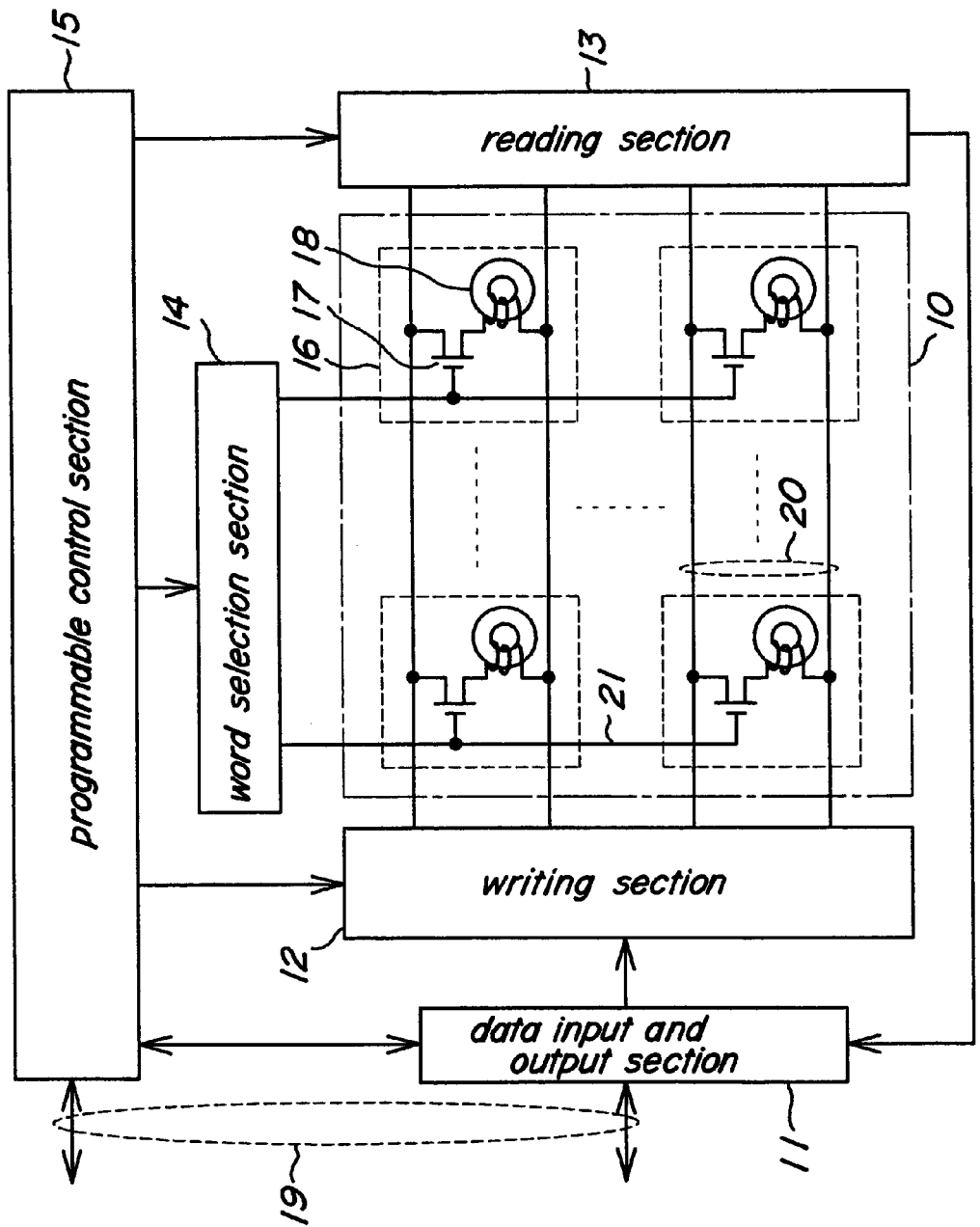
FIG. 2 is a schematic view showing one embodiment of the apparatus according to the invention.

FIG. 2 is a schematic view showing one embodiment of the apparatus according to the invention. The apparatus comprises an integrated magnetic cells array 10, a data input and output section 11, a writing section 12, a reading section 13, a word selection section 14 and a programmable control section 15.

The integrated magnetic cells array has a plurality of magnetic cells 16 which form a two-dimensional arrangement. Each of the magnetic memory cells 16 has a NMOS transistor 17, and a ferromagnetic body 18 (e.g. permalloy) which composes a magnetic circuit by being wound with a lead wire connected to the NMOS transistor 17. A detail of the magnetic memory cells will be explained below.

The data input and output section 11 temporally stores information input through an external connection 19, and information added an error detection code and an error correction code by the programmable control section 15 or an external equipment. The data input and output section 11 also sends these information to the writing section 12, temporally stores the information read by the writing section 12, and outputs the information from the apparatus.

When each row and/or array corresponding to each of magnetic memory cells 16 is written into an address attached to each of them as a unit called word, the writing section 12 prepares data composed of a single or multiple bits. The writing section 12 and the word selection 14 select the magnetic memory cells 16 to which the data is be written. The writing section 12 writes the data into the magnetic memory cells 16 through data lines 20 connected to sources or drains of the corresponding NMOS transistors 16, respectively. When reading the data, one or more magnetic memory cells 16 from which the data is to be read are selected, and the magnetic memory cells 16 prepares for reading the data.

The reading section 13 detects and reads the data read from one or more magnetic memory cell or cells 16 which are selected by the writing section 12 and the word selection section 14 from respective data lines 20. The word selection section 14 receives respective addresses from the programmable control section 15, and selects the arrays corresponding to respective addresses through respective word selection lines 21.

The programmable control section 15 communicates with external, input and output the information, controls each section, creates the error detection code and the error correction code, detects the error and correct the error. The programmable control section 15 has a simple sequence control function, a block writing function, a block reading function or the like. These functions are determined by the control function thereof. The error detection and the error correction are performed as required.

The programmable control section 15 is composed of a programmable sequence control section or a programmable computing section. The programmable sequence control section is consist of a programmable section by direct wiring at the designing stage or a programmable section at the development stage. On the other hand, the programmable computing section comprises a programmable control computer, a programmable microprogram control computer, a microprogram control computer, a data driving computer or functional memory computer.

The external connection 19 serves for giving and receiving the information for writing and reading for one or more external machines, the information of the address and the information to be stored.

In the embodiment, when the information to be input to and output from the data input and output section 11 is stored per unit, the integrated magnetic cells array 10 is composed so as to memorize at the most efficiency, be high-speed, have a mass storage, and minimize the number of the element of the apparatus and the area of the apparatus as a whole. Each section is initialized by a command from external.

The input and output condition, the reading and writing rates and the memory capacity of the apparatus are generally determined by the number of fun out of one or more MOS transistors in the writing section 12 and word selection section 14, the ability for driving the magnetic memory cells 16, that for amplifying and detecting the reading section 13, and the resistance and the distributed capacitance of the data line 20 and the word selection line 21, or the like. In other words, the basic structure of the integrated magnetic cells array 10 is determined so that the magnetic memory cell 16 has the optimum arrangement to be satisfied such conditions.

Moreover, in such a basic structure, if the specification thereof is fully satisfied, each selection is subdivided so as to be rapid as a whole. That is, in order to make the apparatus higher-speed and have more storage capacity, the apparatus is consist of the combination of the basic unit thereof under the above-mentioned consideration.

FIG. 3 is a sectional view of the magnetic memory cell. This corresponds to each of the magnetic memory cells 16 shown in FIG. 2. In this case, a $n^+$ source 23 and a $n^+$ drain 24 are formed in a P type of a silicon substrate 22, and the $n^+$ source 23, the $n^+$ drain 24 and a gate electrode 25 composes the NMOS transistor 17 shown in FIG. 2. The $n^+$ source 23 is contacted with a conductor 26 and oxide insulating films 27, 28. The $n^+$ drain 24 is contacted with a conductor 29 and oxide insulating films 28, 30. The ferromagnetic body 18 composes a magnetic circuit by being wound with the conductor 29 through the oxide insulating films 28, 30. Such a magnetic memory cell is formed using a semiconductor integrated circuit manufacturing technique, a semiconductor integrated hyperfine processing technique, a ferromagnetic body manufacturing technique or the like.

Figure 4A:
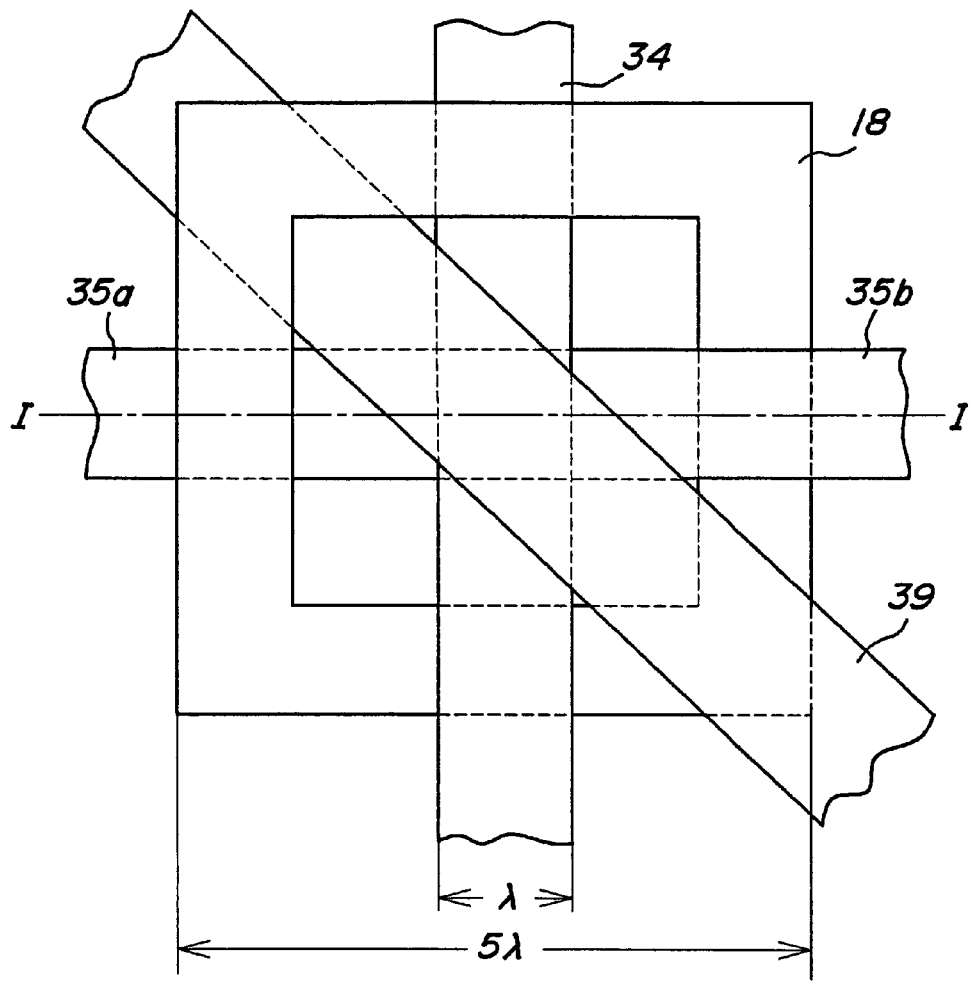
FIG. 4A is a top view of further magnetic memory cell shown in FIG. 2.
Figure 4B:
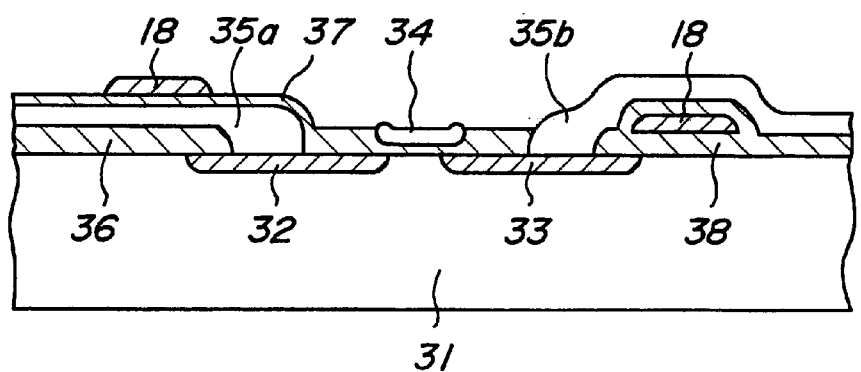
FIG. 4B is a sectional view of further magnetic memory cell shown in FIG. 2.

FIG. 4A is a top view of further magnetic memory cell, and FIG. 4B is a sectional view thereof. This also corresponds to each of the magnetic memory cell 16 shown in FIG. 2. In this case, a $n^+$ source 32 and a $n^+$ drain 33 are formed in a P type of a silicon substrate 31, and the $n^+$ source 32, the $n^+$ drain 33 and a gate electrode 34 compose the NMOS transistor 17 shown in FIG. 2. The $n^+$ source 32 is contacted with a conductor 35a and oxide insulating films 36, 37. The $n^+$ drain 33 is contacted with a conductor 35b and oxide insulating films 37, 38. A conductor 39 corresponds to the data line 20 shown in FIG. 2. The ferromagnetic body 18 has a shape which can magnetize at circular direction as shown. Such a magnetic memory cell is also formed using a semiconductor integrated circuit manufacturing technique, a semiconductor integrated hyperfine processing technique, a ferromagnetic body manufacturing technique or the like. In this case, as most parts of the surface of the magnetic memory cell are covered with a metal, it is hardly affected by α rays or the like from external. If each of the line widths of the gate electrode 34 and the conductors 35a, 35b, 39 is λ, the length of the outer edge of the ferromagnetic body 18 is 5λ.

Figure 5:
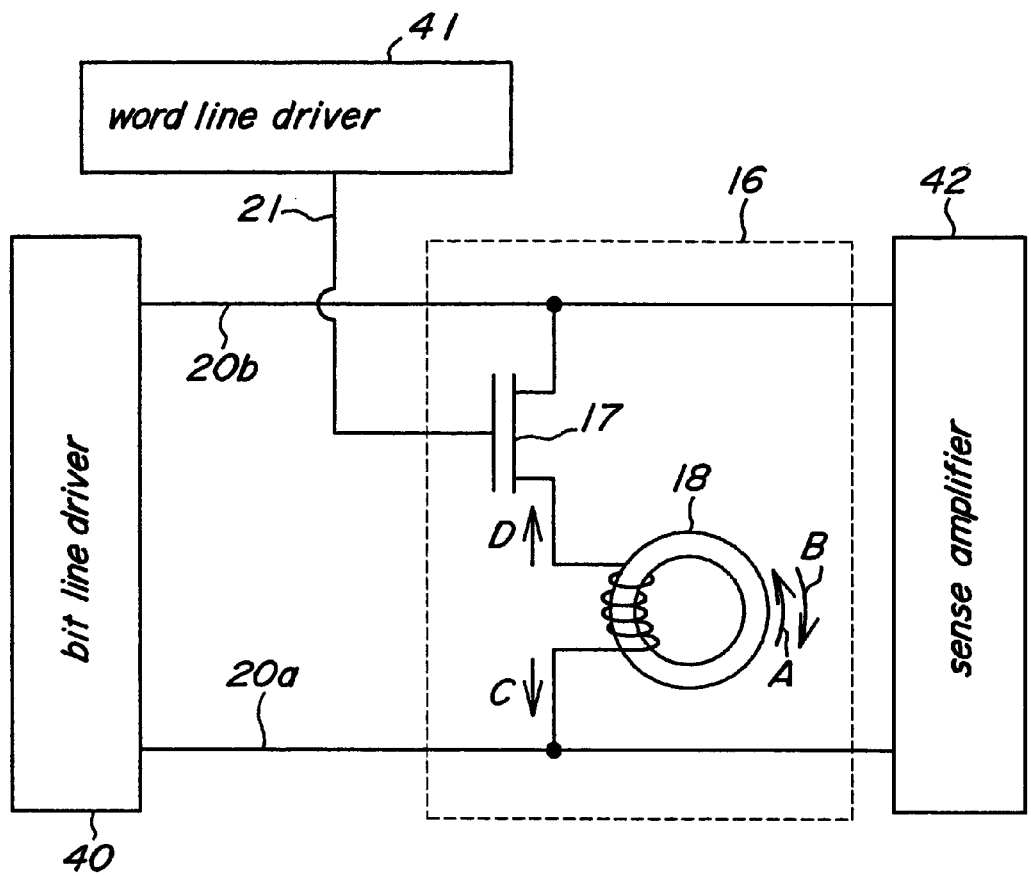
FIG. 5 is a detail drawing of the magnetic memory shown in FIG. 2.

The operation of the embodiment will be explained with reference to FIG. 5. In FIG. 5, a bit line driver 40, a word line driver 41 and a sense amplifier 42 correspond to parts of the writing portion 12, the reading portion 13 and the word selection portion 14 in FIG. 2, respectively.

Figure 6:
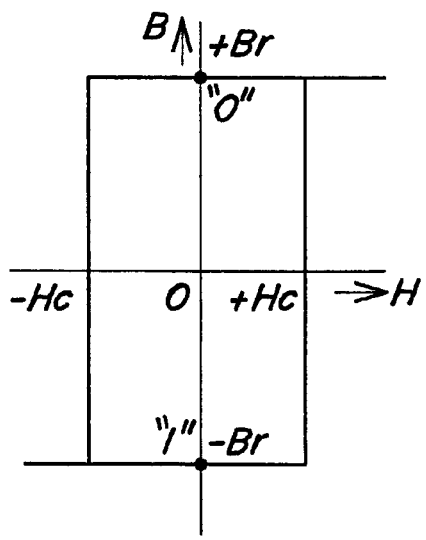
FIG. 6 is a graph showing a magnetic hysteresis curve of the magnetic memory cell shown in FIG. 2.

In the embodiment, the direction of the magnetization is changed by the movement of the magnetic domain wall. Therefore, in a magnetic hysteresis curve as shown in FIG. 6, the residual magnetism −Br with the magnetic field being 0 corresponds to "1" as a first value (In FIG. 5, the ferromagnetic body 18 is magnetized in A direction), and the residual magnetism +Br with the magnetic field being 0 corresponds to "0" as a second value (In FIG. 5, the ferromagnetic body 18 is magnetized in B direction).

In the following explanation, a readout mode thereof is a destructive mode in which the data in the magnetic memory cell 16 are destructed once the data therein are read. In this way, the data reading time is symmetrical to the data writing time, so that the strong outputs from data lines 20a, 20b are obtained, respectively, the detection by the sense amplifier 42 becomes easy.

When reading the data in the magnetic memory cells 16, the level of a word selection line 21 becomes high and the NMOS transistor 17 is turned-on. When the ferromagnetic body 18 is magnetized in the A direction, current flows in C direction in accordance with electromagnetic induction, so that a sense amplifier 42 obtains the electric potential through the data line 20a. As a result, the sense amplifier 42 outputs the data corresponding to "1".

On the other hand, when the ferromagnetic body 18 is magnetized in the B direction, current flows in D direction in accordance with electromagnetic induction, so that a sense amplifier 42 obtains the electric potential through the data line 20b. As a result, the sense amplifier 42 outputs the data corresponding to "0".

As the data in the magnetic memory cell 16 is destructed once the data therein are used, when the data corresponding to "1" are read, the bit line driver 40 apply the electric potential corresponding to the data to the bit line 20b, and the data is rewrite into the magnetic memory cell 16 in accordance with electromagnetic induction. On the other hand, when the data corresponding to "0" are read, the bit line driver 40 apply the electric potential corresponding to the data to the bit line 20a, and the data is rewrite into the magnetic memory cell 16 in accordance with electromagnetic induction. In this way, the condition prior to the reading the data can be achieved.

When the data corresponding to "1" are written into the magnetic memory cell 16, the bit line driver 40 apply the electric potential corresponding to the data to the bit line 20b, the NMOS transistor 17 is turned-on, and the data is rewritten into the magnetic memory cell 16 in accordance with electromagnetic induction. On the other hand, when the data corresponding to "0" are written into the magnetic memory cell 16, the bit line driver 40 apply the electric potential corresponding to the data to the bit line 20a, and the data is rewritten into the magnetic memory cell 16 in accordance with electromagnetic induction. After then, the level of the word selection line 21 drops and the NMOS transistor 17 is turned-off.

According to the embodiment, as the apparatus has the non-volatile property, the non-volatile readout is possible. Because of the asymmetric property in which data can be read more rapidly, it is possible to shorten the delay time between the cache memory and the main memory. If the apparatus has a larger amount of storage, it can be used in place of the magnetic disc, through, without occurrence of a large delay time between the main memory and a secondary storage. Therefore, the memory in a system can perform a fast storage action. Further, if it is formed on an integrated circuit, such magnetic memory cells can be formed to have a desired two or three-dimensional form, so that the memory can have a large amount of storage. Moreover, by storing the data of the first value (e.g. 1) or the second value (e.g. 0) according to direction of the magnetization or magnetizing force, the contents thereof is not erased even if the voltage supply is turned-off, so that the memory can have the non-volatile property. As a result, the power consumption becomes lower because the it is not required to refresh such as the case where the DRAM is used. As it is unnecessary to refresh as such, the computer itself or the peripheral circuit of the apparatus can have a simple structure. The apparatus of the embodiment does not suffer from the above-mentioned disadvantages of the prior art.

Further, in such a apparatus, prior semiconductor integrated circuit design and manufacture technique can be utilized by one or more semiconductor manufacturers, and the research and the development about the material of the ferromagnetic body and the thin film thereof are fully carried out. Therefore, the apparatus according to the invention can be manufactured using one or more prior manufacturing equipment, and the area of the apparatus and the number of the element thereof can be substantially same as the prior DRAM.

Especially, the delay time in the virtual storage mechanism in computers which could not be realized except that the non-volatile property is required for the magnetic disc in the past, can be much shorter. As a result, the storage hierarchy can be simple. Moreover, a high-speed and mass storage medium can be achieved instead of a storage medium such as a magnetic tape, a magnetic disc, an optical disc or the like which is slow and have a large amount of storage.

Recently, in the field of multimedia, it is required to realize a data storing apparatus which has high-speed, mass and non-volatile properties capable of memorizing a large amount of very high resolution image such as an image sensor for an artificial satellite, medical image, digital image or the like. According to the embodiment, such an apparatus can be achieved.

Figure 7:
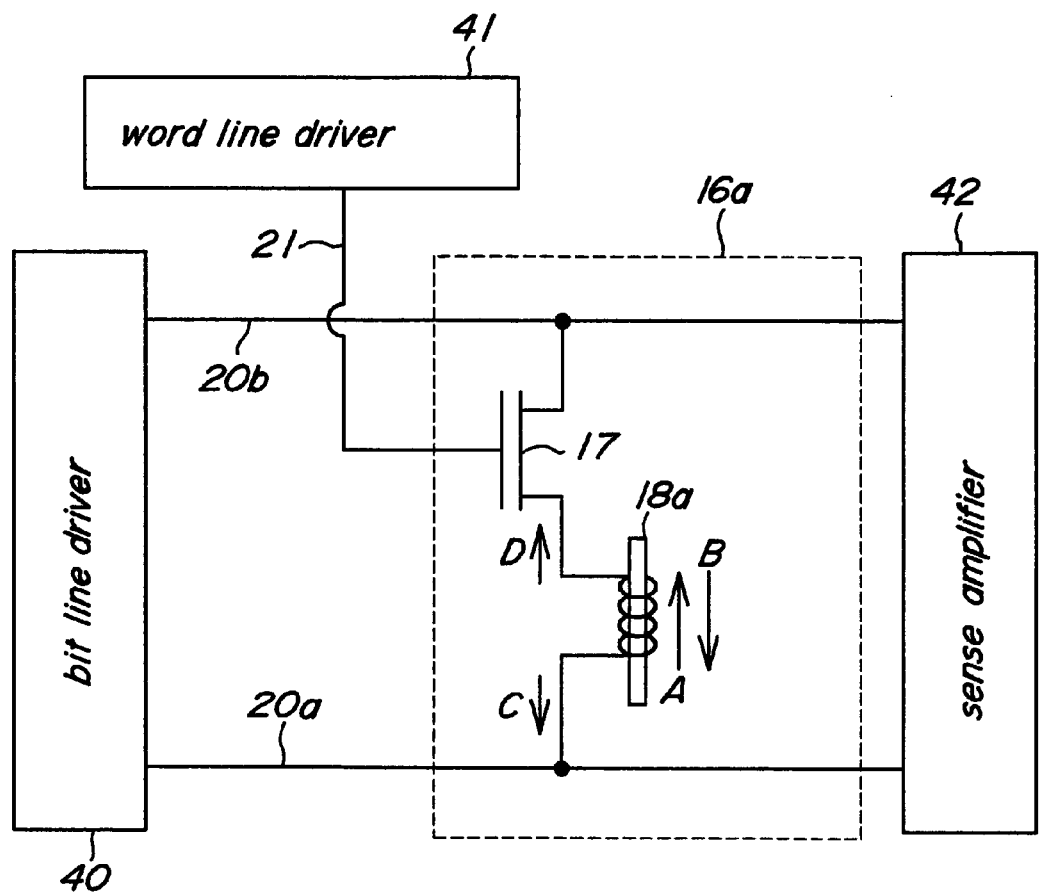
FIG. 7 is a detail drawing of further magnetic memory shown in FIG. 2.

FIG. 7 is a detail drawing of further magnetic memory. In this case, A magnetic memory cell 16a has a rod-shaped ferromagnetic body 18a, and the first value corresponds to "1" (i.e. the ferromagnetic body 18a is magnetized in A direction in FIG. 7), and the second value corresponds to "0" (i.e. ferromagnetic body 18a is magnetized in B direction in FIG. 7). Such a rod-shaped ferromagnetic body 18a can be used.

Figure 8:
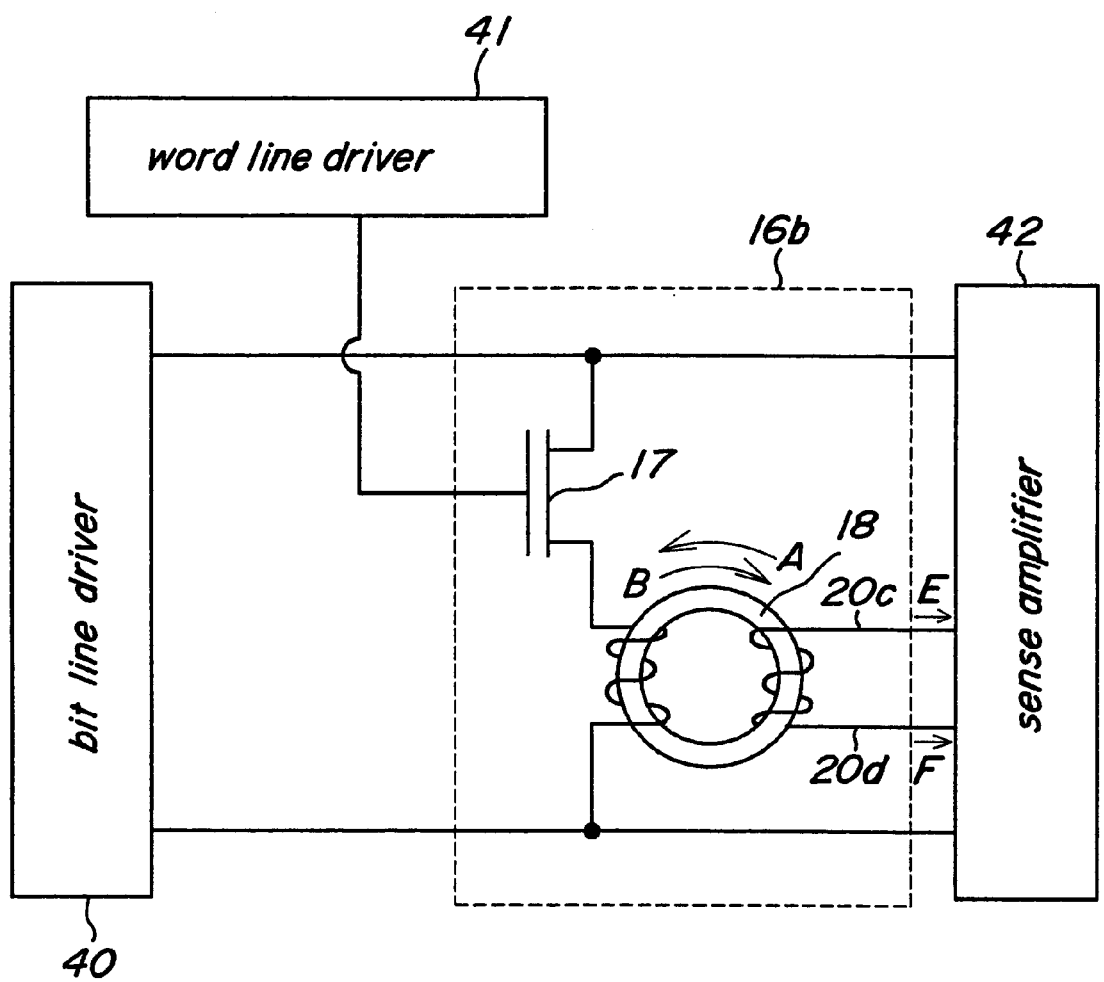
FIG. 8 is a detail drawing of further magnetic memory shown in FIG. 2.

FIG. 8 is a detail drawing of further magnetic memory. In this case, when reading the data stored in a magnetic memory cell 16b, current flows in E direction in accordance with electromagnetic induction if the magnetic memory cell 18 is magnetized in A direction, so that a sense amplifier 42 obtains the electric potential through a data line 20c. As a result, the sense amplifier 42 outputs the data corresponding to "1".

On the other hand, current flows in F direction in accordance with electromagnetic induction if the magnetic memory cell 18 is magnetized in B direction, so that a sense amplifier 42 obtains the electric potential through a data line 20d. As a result, the sense amplifier 42 outputs the data corresponding to "0".

FIG. 9A is a schematic view showing the magnetic which has a multilayer, FIG. 9B is a top view of a part of the magnetic memory cell shown in FIG. 9A. In this case, the reading and writing operations of multilayered magnetic memory cells 44a, 44b, 44c, . . . are preformed with a single NMOS transistor 43. Each of magnetic memory cells 44a, 44b, 44c, . . . has ferromagnetic bodies 45a, 45b, 45c, . . . , and auxiliary data lines 46a, 46b, 46c, . . . , respectively. Each of auxiliary data lines 46a, 46b, 46c, . . . corresponds to each of ferromagnetic bodies 45a, 45b, 45c. . . .

In such a way, by multilayering the magnetic memory cells 44a, 44b, 44c, . . . , the reading and writing of the data in the ferromagnetic body 45a, 45b, 45c, . . . can be performed with a single NMOS transistor 43 and the auxiliary data lines 46a, 46b, 46c, . . . .

FIG. 10 is a detail drawing of further magnetic memory. In this case, a magnetic memory cell 16c has a CMOS 47 as the current control means. The sense amplifier 42 is connected to a conductor 48 which is wound around a ferromagnetic body 18.

The operation of the embodiment will be explained as to the destructive readout mode. When reading the data from the magnetic memory cell 16c, the levels of a word selection line 21a and a word selection line 21b rise, a NMOS transistor 47a is turned-on and a PMOS transistor 47b is turned-off. If the ferromagnetic body 18 is magnetized in A direction, current flows in G direction in accordance with electromagnetic induction, so that the sense amplifier 42 obtains the electric potential through a conductor 48. As a result, the sense amplifier 42 reads the data corresponding to "1".

On the other hand, If the ferromagnetic body 18 is magnetized in B direction, current flows in H direction in accordance with electromagnetic induction, so that the sense amplifier 42 reads the data corresponding to "0".

In the case where the data corresponding to "1" is read, the bit line driver 40 apply the electric potential corresponding to "1" to the data line 20a so that the NMOS transistor 47a is turned-on and the PMOS transistor 47b is turned-off. Therefore, the data is rewritten into the magnetic memory cell 16c in accordance with electromagnetic induction. On the other hand, in the case where the data corresponding to "0" is read, the bit line driver 40 apply the electric potential corresponding to "0" to the data line 20a so that the NMOS transistor 47a is turned-off and the PMOS transistor 47b is turned-on. Therefore, the data is written into the magnetic memory cell 16c in accordance with electromagnetic induction. In such a way, the condition prior to the reading is recovered.

In the case where the data corresponding to "1" is written, the bit line driver 40 apply the electric potential corresponding to "1" to a conductor 48 so that the NMOS transistor 47a is turned-on, the data is rewritten into the magnetic memory cell 16c in accordance with electromagnetic induction, and then the NMOS transistor 47a is turned-off. On the other hand, in the case where the data corresponding to "0" is written, the bit line driver 40 apply the electric potential corresponding to "0" to the bit line 20b so that the NMOS transistor 47a is turned-on, the data is rewritten into the magnetic memory cell 16c in accordance with electromagnetic induction, and then the PMOS transistor 47b is turned-off.

In this case where the CMOS is used as the current control means in such a way, also, the data of the first value (e.g. 1) or the second value (e.g. 2) can be stored in accordance with direction of magnetization or magnetizing force of the ferromagnetic body 18.

Figure 11:
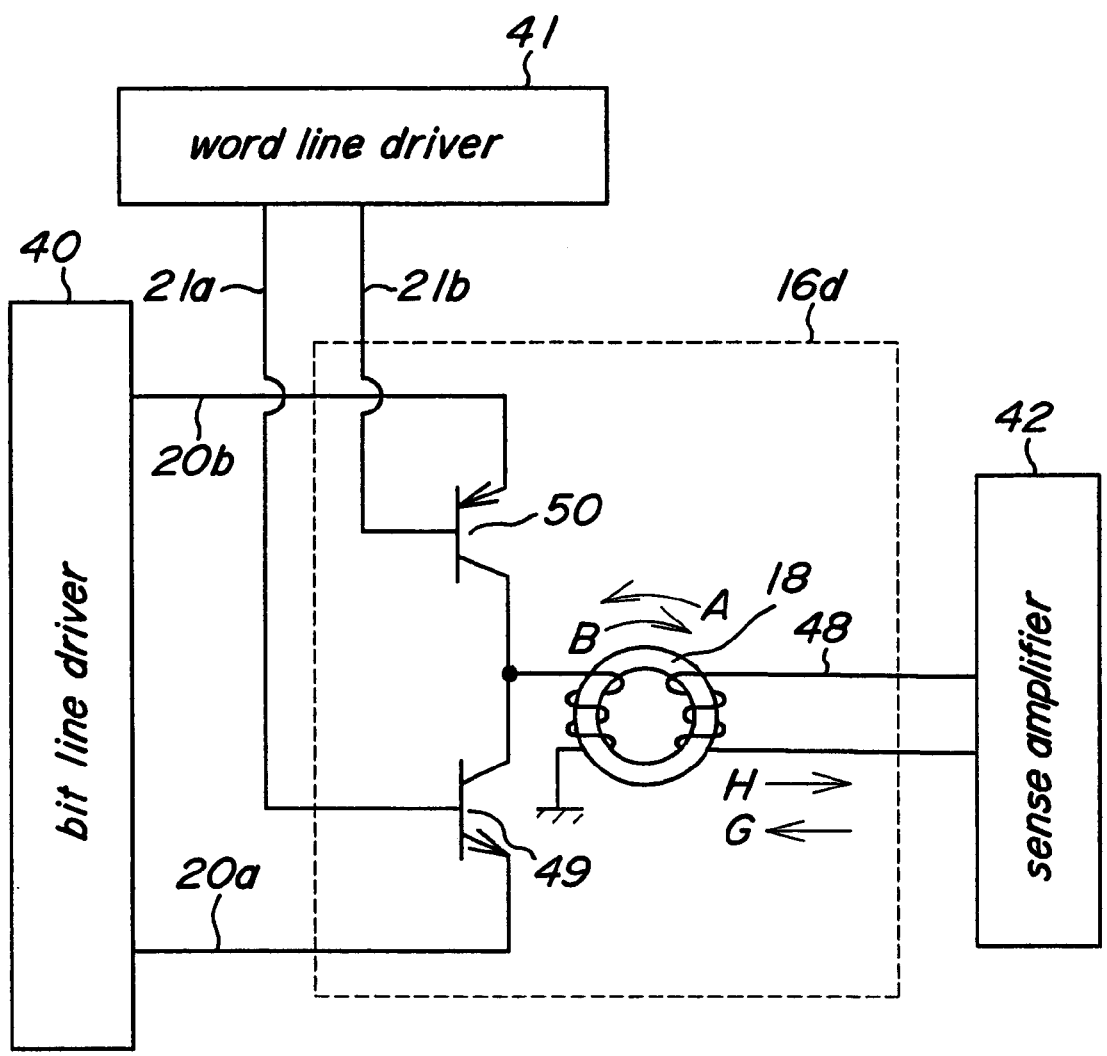
FIG. 11 is a detail drawing of further magnetic memory shown in FIG. 2.

FIG. 11 is a detail drawing of further magnetic memory. A magnetic memory cell 16d has a NPN type of a transistor 49 and a PNP type of a transistor 50 as the current control means. In this case, also, the sense amplifier 42 is connected to the conductor 48 wound around the ferromagnetic body 18.

The operation of the embodiment will be explained as to the destructive readout mode. When reading the data from the magnetic memory cell 16d, the levels of a word selection line 21a and a word selection line 21b rise, a NPN type of a transistor 49 is turned-on and a PNP type of a transistor 50 is turned-off. If the ferromagnetic body 18 is magnetized in A direction, current flows in G direction in accordance with electromagnetic induction, so that the sense amplifier 42 obtains the electric potential through the conductor 48. As a result, the sense amplifier 42 reads the data corresponding to "1".

On the other hand, if the ferromagnetic body 18 is magnetized in B direction, current flows in H direction in accordance with electromagnetic induction, so that the sense amplifier 42 obtains the electric potential through the conductor 48. As a result, the sense amplifier 42 reads the data corresponding to "0".

In the case where the data corresponding to "1" is read, the bit line driver 40 apply the electric potential corresponding to "1" to the data line 20a so that the NPN type of the transistor 49 is turned-on. Therefore, the data is rewritten into the magnetic memory cell 16d in accordance with electromagnetic induction. On the other hand, in the case where the data corresponding to "0" is read, the bit line driver 40 apply the electric potential corresponding to "0" to the data line 20b so that the PNP type of the transistor 50 is turned-on. Therefore, the data is rewritten into the magnetic memory cell 16d in accordance with electromagnetic induction. In such a way, the condition prior to the reading is recovered.

In the case where the data corresponding to "1" is written, the bit line driver 40 apply the electric potential corresponding to "1" to the data line 20a so that the NPN type of the transistor 49 is turned-on, the data is rewritten into the magnetic memory cell 16d in accordance with electromagnetic induction, and then the NPN type of the transistor 49 is turned-off. On the other hand, in the case where the data corresponding to "0" is written, the bit line driver 40 apply the electric potential corresponding to "0" to the data line 20b so that the NPN type of the transistor 50 is turned-on, the data is rewritten into the magnetic memory cell 16d in accordance with electromagnetic induction, and then the PNP type of the transistor 50 is turned-off.

In case where the first conductive type of the transistor and the second conductive type of the transistor (i.e. the NPN type of the transistor and the PNP type of the transistor) are used as the current control means in such a way, also, the data of the first value (e.g. 1) or the second value (e.g. 0) can be stored in accordance with direction of the magnetization or magnetizing force of the ferromagnetic body 18.

Figure 12:
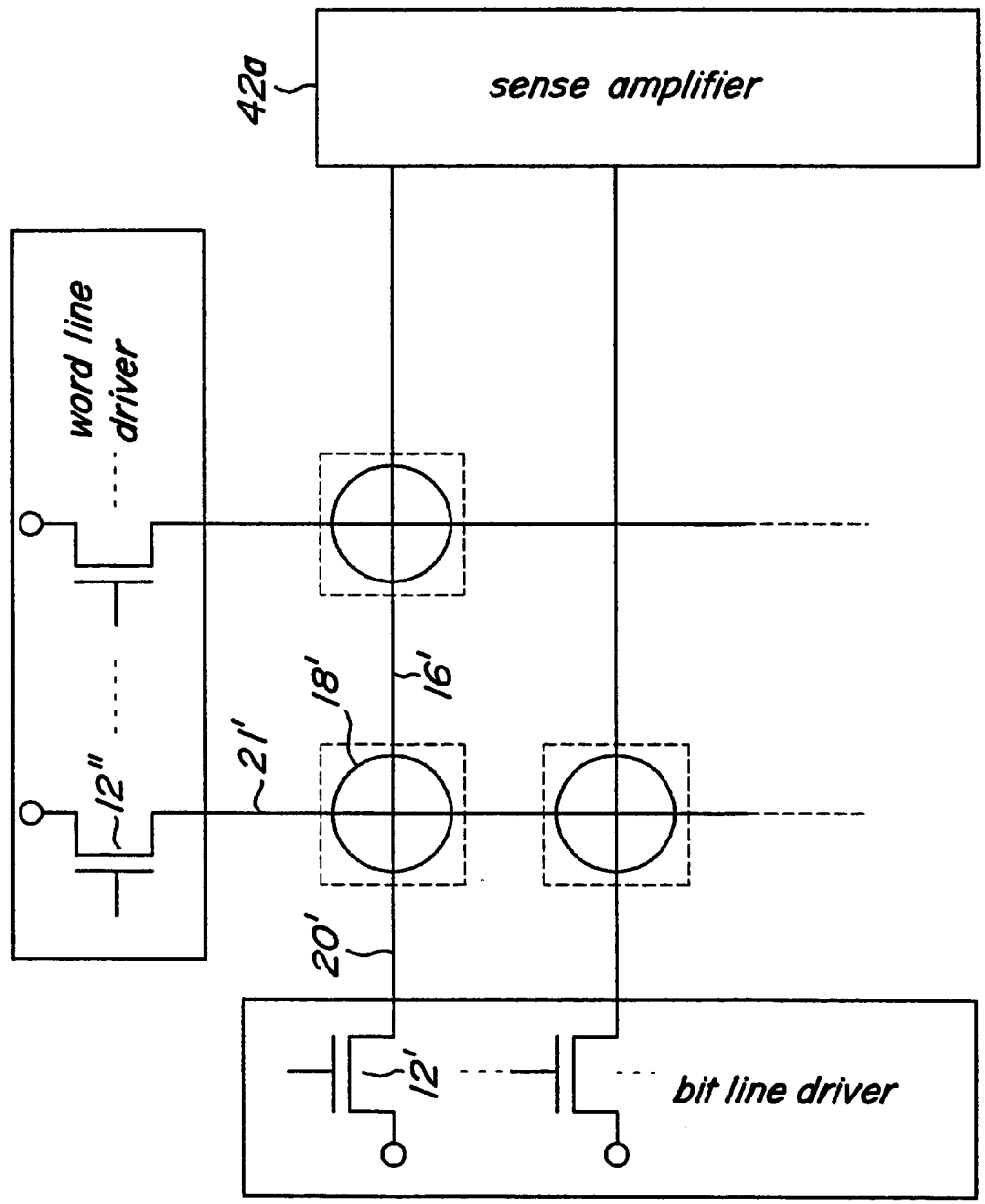
FIG. 12 is a schematic view showing another embodiment of the apparatus according to the invention.

FIG. 12 is a schematic view showing another embodiment of the apparatus according to the invention. In the embodiment, each magnetic memory cell 16' has a ferromagnetic film 18' (e.g. permalloy). A writing section (not shown) corresponding to the writing section 12 shown in FIG. 2, has NMOS transistors 12' and 12" corresponding to each row. A sense amplifier 42a which detects the electric potential obtained through a data line 20', constitutes a part of the reading section corresponding to the reading section shown in FIG. 2.

Figure 13A:
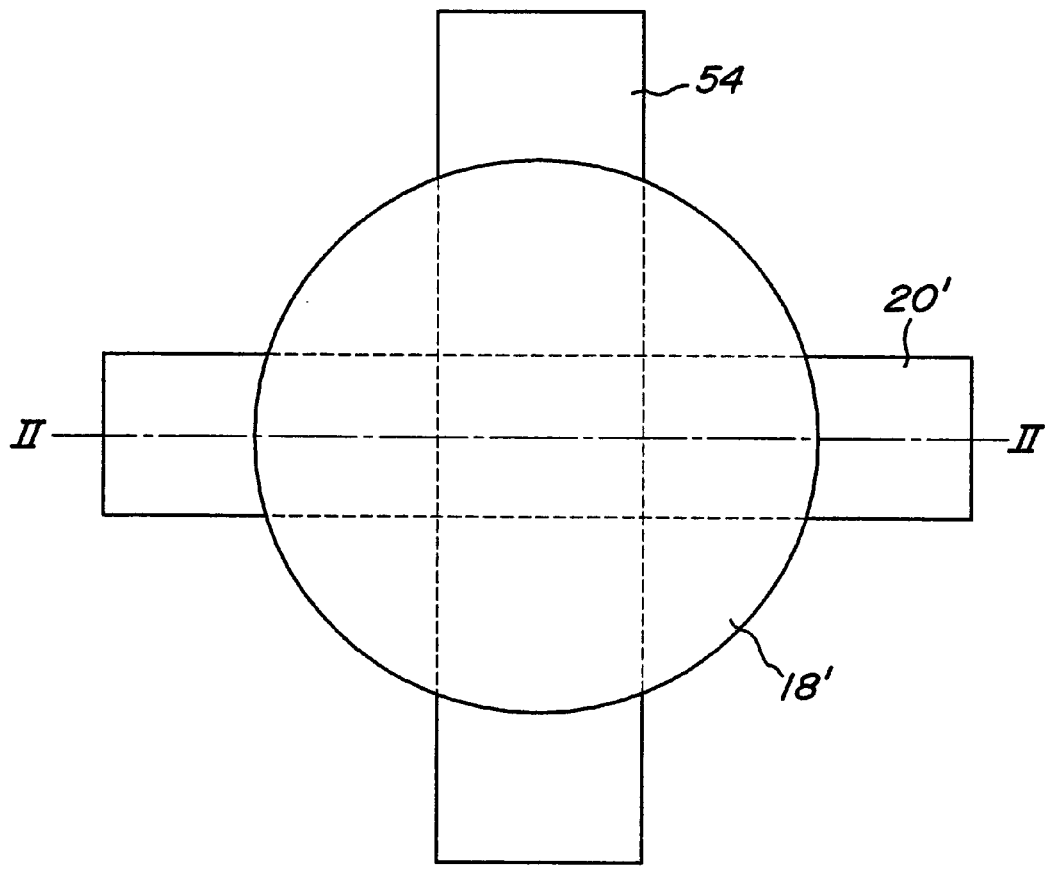
FIG. 13A is a top view of the magnetic memory cell shown in FIG. 12.
Figure 13B:
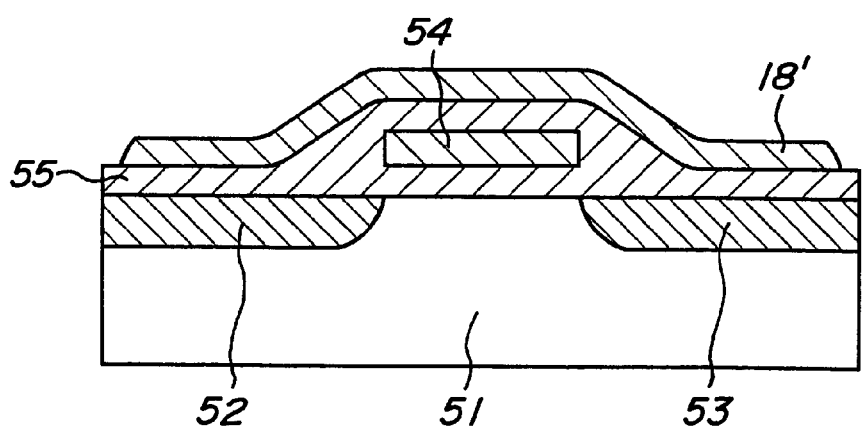
FIG. 13B is a sectional view of the magnetic memory cell shown in FIG. 12.

FIG. 13A is a top view of the magnetic memory cell shown in FIG. 12, and FIG. 13B is a sectional view of the magnetic memory cell shown in FIG. 12 along the line II—II. In this case, a n$^+$ source 52 and a n$^+$ drain 53 are formed in a P type silicone substrate 51, the n$^+$ source 52, the n$^+$ drain 53 and a gate electrode 54 (which corresponds to the word line 21' shown in FIG. 12) constitute a NMOS transistor 12'. The n$^+$ source 52 and the n$^+$ drain 53 are contacted with an oxided insulating film 55, and the oxided insulating film 55 is covered with a ferromagnetic thin film 16'. Such a magnetic memory cell is formed using a semiconductor integrated circuit manufacturing technique, a semiconductor integrated hyperfine processing technique, a ferromagnetic body manufacturing technique or the like. In this case, most part of the surface of the magnetic memory cell is covered with a metal, the magnetic memory cell does not substantially suffer from the affection of α rays or the like.

In the embodiment, direction of magnetization of the magnetic memory cell is inverted by rotation of the easy axis of magnetization thereof. Therefore, as shown in FIG. 14, the first value (e.g. 1) corresponds to a first easy axis of magnetization Y having a certain angle to an easy axis of magnetization X thereof, and the second value (e.g. 0) corresponds to a second easy axis of magnetization Z having direction opposite to that of the first easy axis of magnetization Y, so that storing operation with 1-bit is performed.

The operation of the embodiment will be explained as to the destructive readout mode with reference to FIG. 14.

When reading the data in a magnetic memory cell 16', NMOS transistors 12' and 12" corresponding to the raw and the array thereof are turned-on, respectively. If the ferromagnetic body 18' is magnetized in the direction Y, i.e. value 1 is stored, current corresponding to a magnetization vector Ya flows in direction a through a data line 20', and that corresponding to an easy axis of magnetization Yb flows in direction b through a word line 21'. The sum of these currents corresponds to current required to write the data as described below. Therefore, a sense amplifier 42a obtains the electric potential through the data line 20'. As a result, a reading section (not shown) reads the data corresponding to "1".

On the other hand, If the ferromagnetic body 18' is magnetized in the direction Z, current corresponding to an easy axis of magnetization Zc flows in direction c through a data line 20', and that corresponding to an easy axis of magnetization Zd flows in direction d through a word line 21'. The sum of these currents corresponds to current required to invert direction of the easy axis of magnetization. Therefore, a sense amplifier 42a obtains the electric potential through the data line 20'. As a result, a reading section (not shown) reads the data corresponding to "0".

When reading the data corresponding to "1" from the magnetic memory cell 16', each of currents having a half of that required to invert direction of easy axis of magnetization, flows in the directions a and b, with NMOS transistors 12' and 12" being turned-on, respectively, so that the data is rewritten into the magnetic memory cell 16' in accordance with electromagnetic induction. On the other hand, when reading the data corresponding to "0" from the magnetic memory cell 16', each of currents having a half of that required to invert direction of easy axis of magnetization, flows in the directions c and d, with NMOS transistors 12' and 12" being turned-on, respectively, so that the data is written into the magnetic memory cell 16' in accordance with electromagnetic induction. In such a way, the condition prior to the reading is recovered.

When writing the data corresponding to "1" into the magnetic memory cell 16', each of currents having a half of that required to invert direction of easy axis of magnetization, flows in the directions a and b, with NMOS transistors 12' and 12" being turned-on, respectively, so that the data is rewritten into the magnetic memory cell 16' in accordance with electromagnetic induction. And then, NMOS transistors 12' and 12" are turned-off, respectively. On the other hand, when writing the data corresponding to "0" into the magnetic memory cell 16', each of currents having a half of that required to invert direction of easy axis of magnetization, flows in the directions c and d, with NMOS transistors 12' and 12" being turned-on, respectively, so that the data is rewritten into the magnetic memory cell 16' in accordance with electromagnetic induction. And then, NMOS transistors 12' and 12" are turned-off, respectively.

By using such a ferromagnetic thin film, the first value (e.g. 1) or the second value (e.g. 0) can be stored in accordance with rotation of easy axis of magnetization.

While the present invention has been described above with reference to certain preferred embodiments, it should be noted that they were present by way of examples only and various changes and/or modifications may be made without departing from the scope of the invention. For example, a PNOS transistor can be used instead of the NMOS transistor in the embodiment. The apparatus according to the present invention has any other construction than that shown in FIGS. 3, 4 and 14.

In the apparatus shown in FIG. 2, the functions of the data input and output section 11, the writing section 12, the reading section 13 and the word selection section 14 are composed separately, however, a part of or all functions are integrated into the programmable control section 15.

A plurality of the magnetic memory cell arrays 10 and sections corresponding to each of them (i.e. the data input and output section 11, the writing section 12, the reading section 13, the word selection section 14 and the programmable control section 15) can be provided, and separate or parallel writing and reading operations for each of the magnetic memory cell arrays 10 can be performed.

The data input and output section 11 can have a single-input and a single-output, a single-input and multiple-outputs, multiple-inputs and a single-output or multiple-inputs and multiple-outputs by composing with separate data input or inputs and separate data output or outputs. Therefore, writing and reading operations from a single or multiple input or inputs and a single or multiple output or outputs on condition that the consistency in the update of the memory can or cannot maintain when writing the data.

If circumstances require, a number of the apparatus according to the present invention are used in accordance with the memory capacity thereof, the time required to read and write the data, the width of the transmission path and the transmission rate, and these apparatuses are controlled by another programmable control section, so that the high-speed operation and the mass-storage thereof can be achieved.

In the embodiment, the destructive readout mode is described, however, the non-destructive readout mode is possible in the apparatus according to the present invention. In this case, the reading time thereof becomes asymmetric to the writing time thereof. As a result, the time required to read can make much smaller than that required to write.

In the apparatus according to the present invention, for the sequential reading operation of blocks which is used recently, the high-speed and non-destructive readout mode can be adopted, and the high-speed and simple virtual memory mechanism of computers can be constructed because of the non-volatile property. As a result, the performance of the operating system can be improved.

In addition to the construction of the magnetic memory cells having a multilayer as shown in FIG. 9, the apparatus according to the present invention can have a three-dimensional form by using a biaxial element 18" as shown in FIG. 15. Such a biaxial element comprises a ferromagnetic body with square hysteresis. It has a first hole and a second hole which is not situated on the same face thereof as the face in which the first hole is situated. The data of the first value or the second value (i.e. 1 or 0) is stored in accordance with direction of magnetization around the first or second hole. The writing of the data to the biaxial element is performed by current through a data line which passes through the hole. In this case, also, the control of the direction of the current is carried out by the current control means such as the MOS transistor.

In the embodiment as explained above with reference to FIG. 14, each of easy axes of magnetization Y and Z have a certain angle to easy axis of magnetization X, however, each of easy axes of magnetization Y and Z can be parallel or vertical to easy axis of magnetization X.

Figure 16:
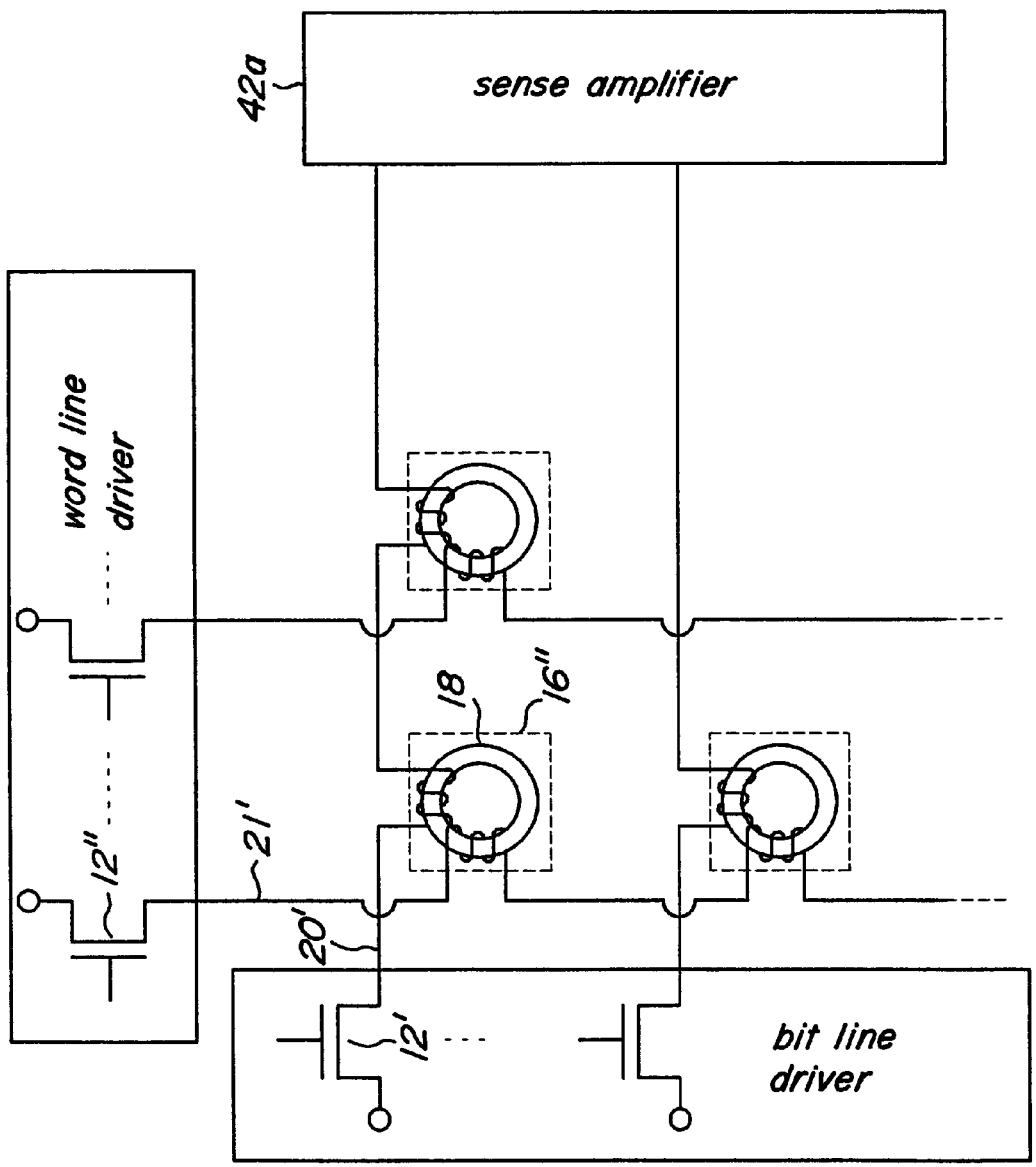
FIG. 16 is a modification of the apparatus shown in FIG. 12.

In the embodiment as explained above with reference to FIGS. 10 and 11, the ferromagnetic thin film 18' as shown in FIGS. 12 and 13 can be used instead of the annular ferromagnetic body. In FIG. 12, the annular ferromagnetic body as shown in FIG. 2 can be used instead of the ferromagnetic thin film 18', and it shows in FIG. 16. In this case, a magnetic memory cell 16" is wound by a data line 20' and a word selection line 21'.

What is claimed is:

1. A data storing apparatus including integrated magnetic memory cells and semiconductor devices, comprising:

magnetic storing means having said magnetic memory cells, each of which memorizes data of a first value or a second value;

data input means through which said data is input to said apparatus;

data writing means for writing said data which is input from said data input means at said memory cells separately or simultaneously in accordance with electromagnetic induction;

selection means for selecting one or more magnetic memory cells from which said data is to be read, or which said data is to be written; and data output means for outputting said data which is read from a data reading means from said apparatus;

each of said magnetic memory cells having a ferromagnetic body holding said data of the first value or the second value according to direction of magnetization or magnetizing strength thereof;

current control means for performing the reading of said data from said selected magnetic cell or cells and the writing of said data into said selected magnetic cell or cells, said current control means comprising said semiconductor devices and controlling current therethrough in both directions.

2. The apparatus according to claim 1, wherein said first value corresponds to a first residual magnetism with a magnetic field in said ferromagnetic body being zero, and said second value corresponds to a second residual magnetism with a magnetic field in said ferromagnetic body being zero;

magnetizing strength of said first residual magnetism is substantially same as that of said second residual magnetism; and the sign of said first residual magnetism is opposite to that of said second residual magnetism.

3. The apparatus according to claim 1, wherein each of said magnetic memory cells including said current control means.

4. The apparatus according to claim 3, wherein said current control means comprises a MOS transistor.

5. The apparatus according to claim 3, wherein said current control means comprises a CMOS.

6. The apparatus according to claim 3, wherein said current control means comprises a first conductive type transistor and a second conductive type transistor.

7. The apparatus according to claim 1, wherein said magnetic memory cells have a matrix form.

8. The apparatus according to claim 1, wherein said current control means has first current control sections corresponding to a respective row of said magnetic memory cells, and second current control sections corresponding to a respective array of said magnetic memory cells;

each of said first and second current control sections comprises a MOS transistor.

9. The apparatus according to claim 1, wherein a readout mode by said data reading means is a destructive readout mode in which said data in said one or more magnetic memory cells are destructed once said data therein are read.

10. The apparatus according to claim 1, wherein a readout mode by said data reading means is a non-destructive readout mode in which said data in said one or more magnetic memory cells are not destructed even if said data therein are read.

11. The apparatus according to claim 1, wherein said ferromagnetic body comprises a ferromagnetic thin film;

said first value corresponds to a first easy axis of magnetization, and said second value corresponds to a second easy axis of magnetization which has direction opposite to that of said first easy axis of magnetization.

12. The apparatus according to claim 11, wherein each of said magnetic memory cells including said current control means.

13. The apparatus according to claim 12, wherein said current control means comprises a MOS transistor.

14. The apparatus according to claim 12, wherein said current control means comprises a CMOS.

15. The apparatus according to claim 12, wherein said current control means comprises a first conductive type transistor and a second conductive type transistor.

16. The apparatus according to claim 11, wherein said magnetic memory cells have a matrix form.

17. The apparatus according to claim 11, wherein said current control means has first current control sections corresponding to a respective row of said magnetic memory cells, and second current control sections corresponding to a respective array of said magnetic memory cells;

each of said first and second current control sections comprises a MOS transistor.

18. The apparent according to claim 11, wherein a readout mode by said data reading means is a destructive readout mode in which said data in said one or more magnetic memory cells are destructed once said data therein are rad.

19. The apparatus according to claim 11, wherein readout mode by said data reading means is a non-destructive readout mode in which said data in said one or more magnetic memory cells are not destructed even if said data therein are read.

* * * * *

UNITED STATES PATENT AND TRADEMARK OFFICE
CERTIFICATE OF CORRECTION

PATENT NO. : 6,166,944  
DATED : December 26, 2000  
INVENTOR(S) : Hiroyuki Ogino Page 1 of 1

It is certified that error appears in the above-identified patent and that said Letters Patent is hereby corrected as shown below:

<u>Column 16,</u>
Line 47, change "rad" to -- read --.
Line 48, after "wherein" insert -- a --.

Signed and Sealed this

Twenty-fifth Day of December, 2001

Attest:

*Attesting Officer*

JAMES E. ROGAN
*Director of the United States Patent and Trademark Office*